United States Patent
Seong (10) Patent No.: US 7,333,365 B2
(45) Date of Patent: Feb. 19, 2008

(54) PAGE BUFFER OF FLASH MEMORY DEVICE WITH IMPROVED PROGRAM OPERATION PERFORMANCE AND PROGRAM OPERATION CONTROL METHOD

(75) Inventor: Jin Yong Seong, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/298,178

(22) Filed: Dec. 8, 2005

(65) Prior Publication Data

US 2006/0215453 A1   Sep. 28, 2006

(30) Foreign Application Priority Data

Mar. 28, 2005   (KR) .................. 10-2005-0025489

(51) Int. Cl.
   *G11C 11/34* (2006.01)
(52) U.S. Cl. ............................. 365/185.12
(58) Field of Classification Search ............ 365/185.12
   See application file for complete search history.

(56) References Cited

U.S. PATENT DOCUMENTS

| | | | |
|---|---|---|---|
| 5,930,172 A | 7/1999 | Kucera | |
| 6,671,204 B2 * | 12/2003 | Im | 365/185.12 |
| 6,963,509 B1 * | 11/2005 | Ju | 365/189.05 |
| 2002/0126531 A1 | 9/2002 | Hosono | |
| 2003/0117856 A1 * | 6/2003 | Lee et al. | 365/189.05 |

FOREIGN PATENT DOCUMENTS

| | | |
|---|---|---|
| JP | 10-334675 | 12/1998 |
| KR | 10-2003-0088595 A | 11/2003 |

* cited by examiner

*Primary Examiner*—Huan Hoang
*Assistant Examiner*—Anthan T Tran
(74) *Attorney, Agent, or Firm*—Townsend and Townsend and Crew LLP (57) ABSTRACT

TA page buffer of a flash memory device has a page buffer that improves the program operation performance and program operation control method thereof. The page buffer has a flash memory device having a MLC. The page buffer stores input data in an upper bit register, initial data having the same value as that of the input that data are stored in a lower bit register.

10 Claims, 5 Drawing Sheets

PAGE BUFFER OF FLASH MEMORY DEVICE WITH IMPROVED PROGRAM OPERATION PERFORMANCE AND PROGRAM OPERATION CONTROL METHOD

BACKGROUND

1. Field of the Invention

The present invention relates to flash memory devices, and more specifically, to a page buffer of a flash memory device with an improved program operation performance and program operation control method.

2. Discussion of Related Art

There is an increasing need for semiconductor memory devices which can be electrically programmed and erased without a refresh function of rewriting data at a predetermined cycle. Furthermore, techniques have been developed for higher integration of memory devices having a large storage capacity.

Flash memory is generally classified into a NAND flash memory and a NOR flash memory. NOR flash memory has a structure in which memory cells are connected to bit lines and word lines independently and is good in a random access time characteristic. NAND flash memory has a construction in which a number of memory cells are connected in series. This type of memory cell has a good characteristic in the level of integration since only one contact is needed per a cell string. Therefore, a NAND structure is generally used in a high-integrated flash memory.

Recently, to further improve the level of integration of the flash memory, there has been research in a multi-bit cell in which data can be stored in one memory cell. A memory cell of this method is generally referred to as a Multi-Level Cell (hereinafter, referred to as "MLC"). A memory cell of a single bit corresponding to the MLC is generally referred to as a Single Level Cell (hereinafter, referred to as "SLC").

In general, threshold voltages (Vt) of MLCs can be distributed in a range of voltage values. For example, since 2-bit data can be programmed into a MLC, one MLC can store any one of four data, i.e., [11], [10], [01] and [00]. Furthermore, a threshold voltage (Vt) of a MLC can be varied depending on stored data. Threshold voltages of memory cells exist within a range of −2.7V or less, 0.3 to 0.7V, 1.3V to 1.7V and 2.3V to 2.7V, respectively. A threshold voltage of a MLC that stores the data [11] therein corresponds to −2.7V or less, and a threshold voltage of a MLC that stores the data [10] therein corresponds to 0.3 to 0.7V. A threshold voltage of a MLC that stores the data [01] therein corresponds to 1.3V to 1.7V and a threshold voltage of a MLC that stores the data [00] therein corresponds to 2.3V to 2.7V.

A MLC employs a page buffer for the purpose of rapid program operation and read operation.

Figure 1:
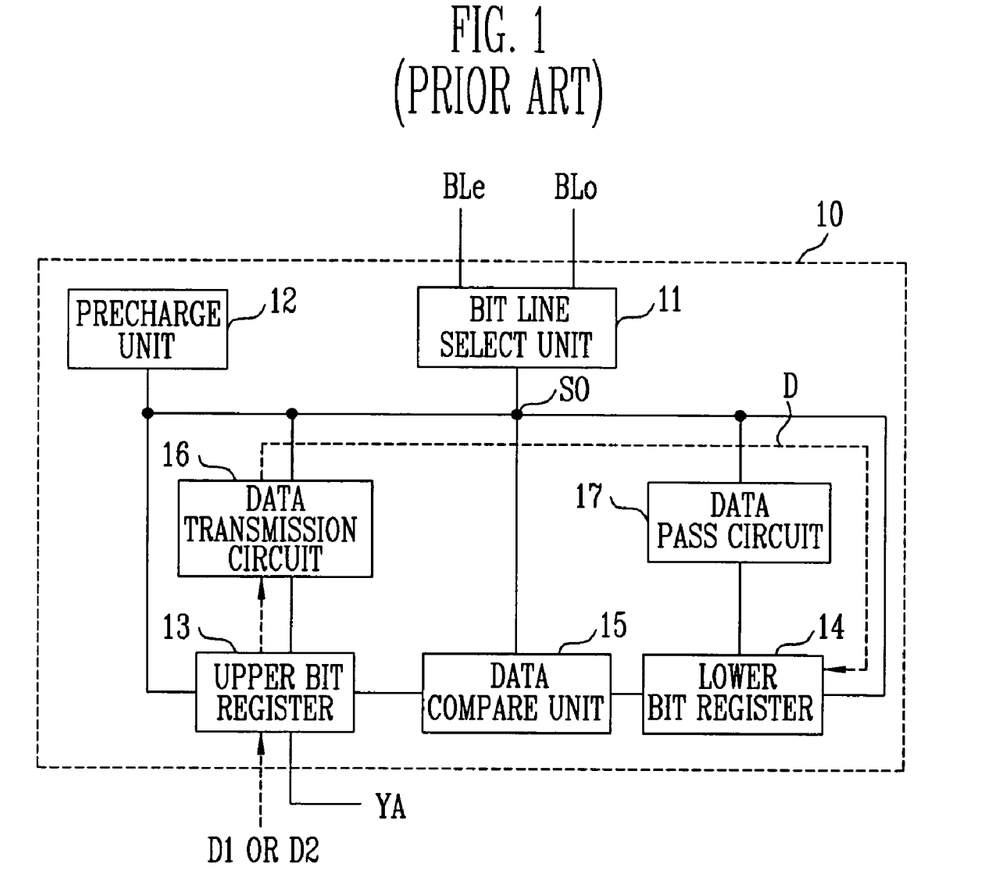
FIG. 1 is a block diagram of a page buffer of a flash memory device having a MLC in the related art.

FIG. 1 is a block diagram of a page buffer of a flash memory device having a MLC in the related art. FIG. 1 schematically shows only blocks concerned with the program operation.

Referring to FIG. 1, the page buffer 10 includes a bit line select unit 11, a precharge unit 12, an upper bit register 13, a lower bit register 14, a data compare unit 15, a data transmission circuit 16 and a data pass circuit 17.

A program operation process executed in the page buffer 10 will be first described below in short. The upper bit register 13 and the lower bit register 14 are initialized to their initial set values. Input data D1 are stored in the upper bit register 13. The data transmission circuit 16 transmits the input data D1, which are received from the upper bit register 13, to the lower bit register 14 as indicated by dotted line "D". Consequently, the lower bit register 14 stores the data D1 therein.

The data pass circuit 17 outputs the data D1, which are received from the lower bit register 14, to a sense node SO. To the sense node SO is connected one of bit lines BLe and BLo by means of the bit line select unit 11. As a result, the input data D1 are programmed into a MLC connected to the bit line BLe or BLo through the bit line BLe or BLo connected to the sense node SO. Through the above process, the program operation of lower bit data into the MLC is completed. In addition, the process of programming upper bit data into the MLC needs a process of transferring the input data D2 to the lower bit register 14 through the data transmission circuit 16 after the input data D2 are programmed into the upper bit register 13, as indicated by a dotted line "D".

As described above, in order to program lower bit data and upper bit data into MLCs, respectively, the page buffer 10 needs the process of transferring the stored data to the lower bit register 14 after the input data are stored in the upper bit register 13. For this reason, when the program operation of the MLC is executed by the page buffer 10, a problem arises because a program time and power consumption during the program operation are increased. In addition, the page buffer 10 require the data transmission circuit 16 for transferring data stored in the upper bit register 13 to the lower bit register 14. A problem also arises because the size and manufacturing cost are increased.

SUMMARY OF THE INVENTION

Embodiments of the present invention provide a page buffer of a MLC flash memory device in which input data stored in an upper bit register and initial data having the same value as that of the input data are stored in a lower bit register.

One embodiment of the present invention provides a program operation control method in which a program time of a MLC flash memory device can be shortened in such a way that input data are stored in an upper bit register and initial data having the same value as that of the input data are stored in a lower bit register.

A page buffer of a flash memory device including a plurality of MLCs connected to at least one pair of bit lines according to the present invention includes a bit line select unit which selects one of the pair of bit lines and connects the selected bit line to a sense node according to bit line select signals and discharge signals, an upper bit register which stores upper bit sensing data and a voltage level of the sense node and outputs first upper bit output data according to an upper bit read signal or stores first or second input data received through a data I/O terminal or outputs second upper bit output data according to data input signals, and a lower bit register which stores lower bit sensing data and outputs first lower bit output data according to a lower bit read signal and the voltage level of the sense node or stores first or second initial data received through a latch initialization circuit or outputs second lower bit output data according to the data input signals.

A program operation control method of a page buffer of a flash memory device including a plurality of MLCs connected to at least one pair of bit lines according to the present invention includes the steps of selecting one of the pair of bit lines and connecting the selected bit line to a sense node in response to bit line select signals and discharge signals, programming first or second initial data stored in a lower bit register into a MLC connected to the selected bit line in response to data input signals as lower bit data, and programming generated upper bit data into the MLC based on the first or second input data input to the upper bit register in response to third or fourth initial data, the lower bit data and the data input signals.

DETAILED DESCRIPTION OF EMBODIMENTS

The present invention will now be described in connection with embodiments with reference to the accompanying drawings.

Figure 2:
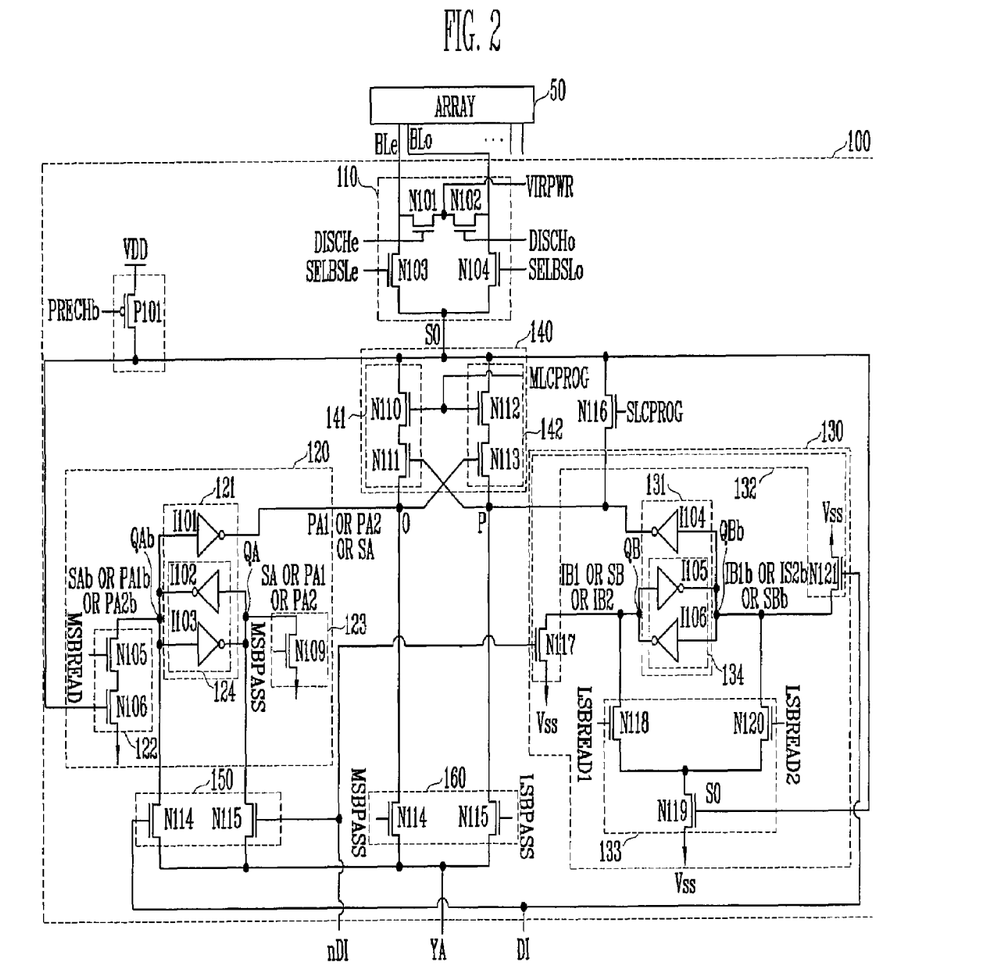
FIG. 2 is a circuit diagram of a page buffer of a flash memory device having a MLC according to an embodiment of the present invention.

FIG. 2 is a circuit diagram of a page buffer of a flash memory device having an array 50 of MLCs according to an embodiment of the present invention. The page buffer is coupled to the memory cell array 50 via at least two bit lines, e.g., an odd bit line BLo and an even bit line BLe.

The page buffer 100 includes a bit line select unit 110, a precharge unit P101, an upper bit register 120, a lower bit register 130, a data compare unit 140, a data input circuit 150, a data output circuit 160 and a data pass circuit N116.

The bit line select unit 110 includes a group of NMOS transistors N101 to N104. NMOS transistor N101 is coupled between even bit line BLe and a bias voltage (VIRPWR) and is turned on or off in response to an even discharge signal (DISCHe). When the NMOS transistor N101 is turned on, the bias voltage (VIRPWR) is applied to the even bit line BLe. NMOS transistor N102 is coupled between odd bit line BLo and the bias voltage (VIRPWR) and is turned on or off in response to an odd discharge signal (DISCHo). When the NMOS transistor N102 is turned on, the bias voltage (VIRPWR) is applied to the odd bit line BLo. NMOS transistor N103 is coupled between the even bit line BLe and a sense node SO and is turned on or off in response to an even bit line select signal (SELBLe). When the NMOS transistor N103 is turned on, the even bit line BLe and the sense node SO are coupled to each other. NMOS transistor N104 is coupled between the odd bit line BLo and the sense node SO and is turned on or off in response to an odd bit line select signal (SELBLo). When the NMOS transistor N104 is turned on, the odd bit line BLo and the sense node SO are coupled to each other.

The precharge unit P101 is coupled between a power supply voltage ($V_{DD}$) and the sense node SO and is turned on or off in response to a precharge signal (PRECHb). When the precharge unit P101 is turned on, the power supply voltage ($V_{DD}$) is applied to the sense node SO, so that the sense node SO is precharged with the power supply voltage ($V_{DD}$) level.

The upper bit register 120 includes an upper bit latch circuit 121, a first sensing circuit 122 and a latch reset circuit 123.

The upper bit latch circuit 121 includes an upper bit latch 124 and an inverter I101. The upper bit latch 124 has inverters I102, I103. The inverters I102, I103 are connected in parallel between a node QAb and a node QA in opposite directions and latch data input to the node QAb or the node QA. The inverter I101 is connected between a node O and the node QAb, and it inverts data (SAb, PA1b or PA2b) received from the upper bit latch 124 and transfers the inverted data to the node O.

The first sensing circuit 122 includes NMOS transistors N105, N106. The NMOS transistors N105, N106 are connected in series between the node QAb and a ground voltage (Vss). The NMOS transistor N105 is turned on or off in response to an upper bit read signal (MSBREAD). The NMOS transistor N106 is turned on or off in response to a voltage level of the sense node SO. Therefore, when the NMOS transistors N105, N106 are turned on, the node QAb and the ground voltage (Vss) are interconnected, so that the ground voltage (Vss) is applied to the node QAb. The voltage level of the node QAb is set to a logic low level (e.g., 0) accordingly.

The latch reset circuit 123 is coupled between the node QA and the ground voltage (Vss) and is turned on or off in response to the upper bit reset signal (MSBPASS). When the latch reset circuit 123 is turned on, the ground voltage (Vss) and the node QA are interconnected and the ground voltage (Vss) is applied to the node QA, so that the node QA is set to a logic low level (e.g., 0) voltage level.

The lower bit register 130 includes a lower bit latch circuit 131, a latch initialization circuit 132 and a second sensing circuit 133.

The lower bit latch circuit 131 includes a lower bit latch 134 and an inverter I104. The lower bit latch 134 includes inverter I105, I106. The inverters I105, I106 are connected in parallel between a node QBb and a node QB in opposite directions and latch data received from the node QBb or the node QB. The inverter I104 is coupled between a node P and the node QBb, and it inverts data (IB1b), IB2b or SBb) received from the lower bit latch 134 and transfers the inverted data to the node P.

The latch initialization circuit 132 includes NMOS transistors N117, N121. The NMOS transistor N117 is coupled between the node QB and the ground voltage (Vss) and is turned on or off in response to an inverse data input signal (nDI). Therefore, when the NMOS transistor N117 is turned on, the node QB and the ground voltage (Vss) are coupled to each other. Therefore, since the ground voltage (Vss) is applied to the node QB, a voltage level of the node QB is set to a logic low level. The NMOS transistor N121 is coupled between the node QBb and the ground voltage (Vss) and is turned on or off in response to a data input signal (DI). When the NMOS transistor N121 is turned on, the node QBb and the ground voltage (Vss) are coupled to each other. Therefore, the ground voltage (Vss) is applied to the node QBb and a voltage level of the node QB is set to a logic low level.

The second sensing circuit 133 includes NMOS transistors N118 to N120. The drain of the NMOS transistor N118 is coupled to the node QB, and the source of the NMOS transistor N118 is coupled to the drain of the NMOS transistor N119. Furthermore, the source of the NMOS transistor N119 is coupled to the ground voltage (Vss). The drain of the NMOS transistor N120 is coupled to the node QBb and the source of the NMOS transistor N120 is coupled to the drain of the NMOS transistor N119. The NMOS transistor N118 is turned on or off in response to a first lower bit read signal (LSBREAD1). The NMOS transistor N119 is turned on or off in response to a voltage level of the sense node SO. The NMOS transistor N120 is turned on or off in response to a second lower bit read signal (LSBREAD2). Therefore, when the NMOS transistor N118 and the NMOS transistor N119 are turned on, the node QB and the ground voltage (Vss) are coupled to each other. A voltage level of the node QB is set to a logic low level accordingly. In addition, when the NMOS transistor N118 and the NMOS transistor N120 are turned on, the node QBb and the ground voltage (Vss) are coupled to each other. A voltage level of the node QBb is set to a logic low level.

The data compare unit 140 includes a first compare unit 141 and a second compare unit 142. The first compare unit 141 includes NMOS transistors N110, N111. The NMOS transistors N110, N111 are connected in series between the sense node SO and the node O. The NMOS transistor N110 is turned on or off I response to a MLC program signal (MLCPROG). The NMOS transistor N111 is turned on or off in response to a voltage level of the node P and connects the sense node SO and the node O or separates them from each other. The second compare unit 142 includes NMOS transistors N112, N113. The NMOS transistors N112, N113 are connected in series between the sense node SO and the node P. The NMOS transistor N112 is turned on or off in response to the MLC program signal (MLCPROG). The NMOS transistor N113 is turned on or off in response to a voltage level of the node O and thus either connects the sense node SO and the node P together or separates them from each other.

The data input circuit 150 includes NMOS transistors N107, N108. The NMOS transistor N107 is coupled between the node QAb and an I/O terminal YA and is turned on or off in response to the data input signal (DI). When the NMOS transistor N107 is turned on, the NMOS transistor N107 transfers data (PA1b) of the I/O terminal YA to the node QAb. The NMOS transistor N108 is coupled between the node QA and the I/O terminal YA and is turned on or off in response to the inverse data input signal (nDI). When the NMOS transistor N108 is turned on, the NMOS transistor N108 transfers data (PA2) of the I/O terminal YA to the node QA.

The data read circuit 160 includes NMOS transistors N114, N115. The NMOS transistor N114 is coupled between the node O and the I/O terminal YA and is turned on or off in response to an upper bit pass signal (MSBPASS). When the NMOS transistor N114 is turned, the NMOS transistor N114 transfers data of the node O to the I/O terminal YA. The NMOS transistor N115 is coupled between the node P and the I/O terminal YA and is turned on or off in response to a lower bit pass signal (LSBPASS). When the NMOS transistor N115 is turned on, the NMOS transistor N115 transfers data of the node O to the I/O terminal YA.

The data pass circuit N116 is coupled between the sense node SO and the node P and is turned on or off in response to a SLC program signal (SLCPROG). When the data pass circuit N116 is turned on, the data pass circuit N116 transfers the data (IB1, IB2 or SB) of the node P to the sense node SO.

Figure 3:
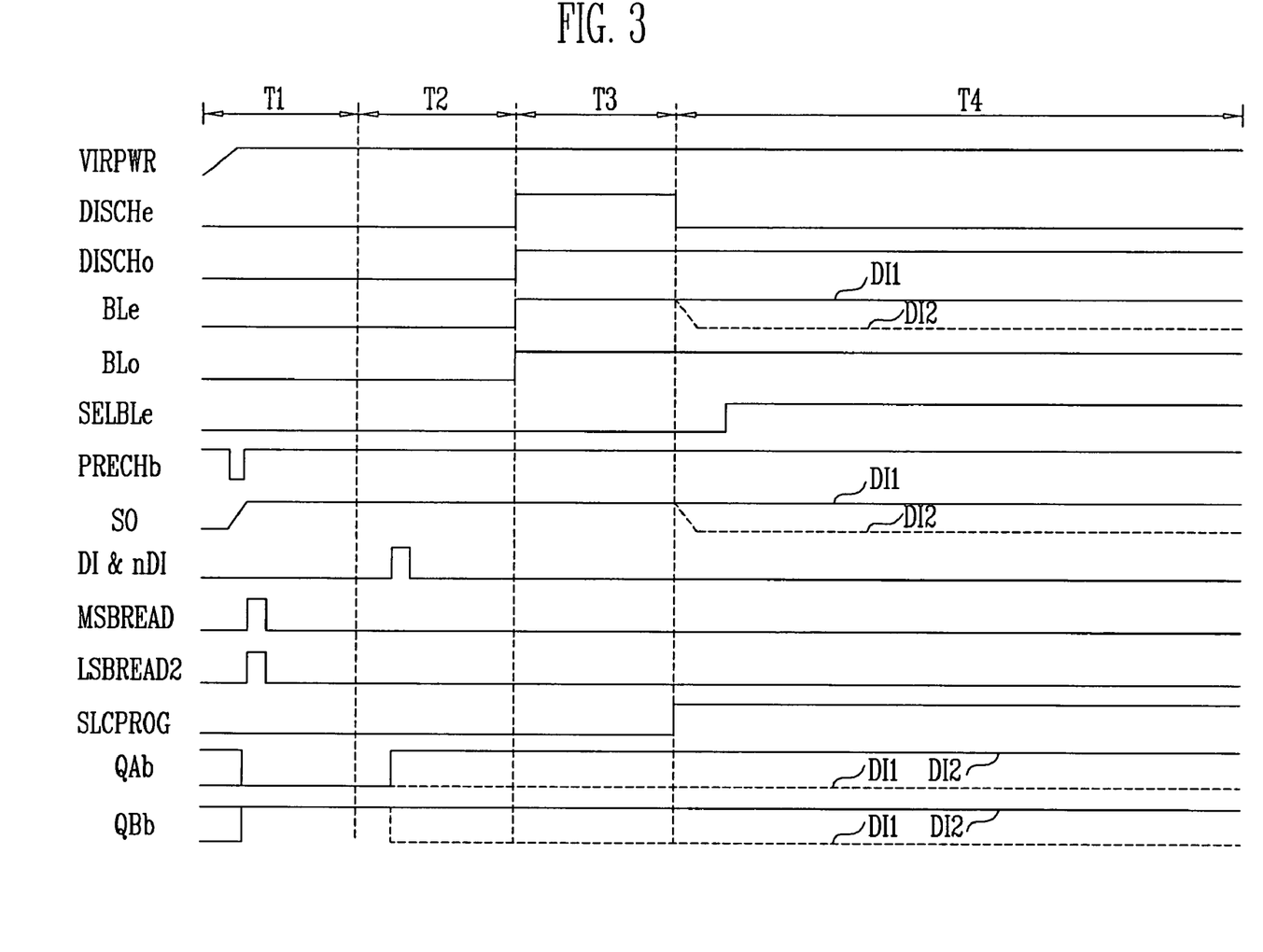
FIG. 3 is a timing diagram illustrating signals related to a lower bit data program operation of a MLC by the page buffer shown in FIG. 2.

FIG. 3 is a timing diagram illustrating signals related to a lower bit data program operation of a MLC by the page buffer shown in FIG. 2. The lower bit program operation by the page buffer 100 will be described in detail with reference to FIG. 3.

A process in which lower bit data are programmed into a MLC connected to the even bit line BLe will be described as an example.

1-1) Period T1 of FIG. 3: Upper Bit Latch and Lower Bit Latch Initialization Period If the precharge signal (PRECHb) is applied to the precharge unit P101 as a logic low level (e.g., 0) during a predetermined time, the precharge unit P101 is turned on to apply the power supply voltage ($V_{DD}$) to the sense node SO. Therefore, the sense node SO is precharged with the power supply voltage ($V_{DD}$) level and a voltage level of the sense node SO is set to a logic high level (e.g., 1). The NMOS transistor N106 of the first sensing circuit 122 is turned on in response to the voltage level of the sense node SO. The upper bit read signal (MSBREAD) of a logic high level is applied to the first sensing circuit 122, so that the NMOS transistor N105 is turned on. For this reason, the ground voltage (Vss) and the node QAb are coupled to each other and the ground voltage (Vss) is applied to the node QAb accordingly. Therefore, a voltage level of the node QAb is initialized to a logic low level and a voltage level of the node QA is initialized to a logic high level. The NMOS transistor N119 of the second sensing circuit 133 is also turned on in response to the voltage level of the sense node SO. The second lower bit read signal (LSBREAD2) of logic high level is applied to the second sensing circuit 133, so that the NMOS transistor N118 is turned on. As a result, the ground voltage (Vss) is applied to the node QB, so that a voltage level of the node QB is initialized to a logic low level and a voltage level of the node QBb is initialized to a logic high level.

1-2) Period T2 of FIG. 3: Data Input Period

In the case where a value of the lower bit data (DI1) to be programmed into a MLC is "1", the data input signal (DI) is applied to the data input circuit 150 and the latch initialization circuit 132. Therefore, the NMOS transistor N107 of the data input circuit 150 is turned on, and the node QAb and the I/O terminal YA are coupled to each other accordingly. When data is inputted, the I/O terminal YA is in a ground state (e.g., logic low). The first input data (PA1b) is input to the node QAb and the upper bit latch 124 latches the first input data (PA1b). As a result, a voltage level of the node QAb is kept to a logic low level and a voltage level of the node QA is kept to a logic high level. At the same time, the NMOS transistor N121 of the latch initialization circuit 132 is turned on and the ground voltage (Vss) and the node QBb are couple to each other accordingly. Therefore, the first initialization data (IB1b) of logic low level is generated in the node QBb and the lower bit latch 134 latches the first initialization data (IB1b). As a result, a voltage level of the node QBb is kept to a logic low level and a voltage level of the node QB is kept to a logic high level.

On the other hand, in the case where a value of the lower bit data (DI2) to be programmed into a MLC is "0", the inverse data input signal (nDI) is applied to the data input circuit 150 and the latch initialization circuit 132 at the same time. Therefore, the NMOS transistor N108 of the data input circuit 150 is turned on and the node QA and the I/O terminal YA are coupled to each other accordingly. Since the I/O terminal YA is in a ground state, the second input data (PA2) of logic low level is transferred to the node QA and the lower bit latch 134 latches the second input data (PA2). As a result, a voltage level of the node QA is kept to a logic low level and a voltage level of the node QAb is kept to a logic high level. Furthermore, the NMOS transistor N117 of the latch initialization circuit 132 is turned on and the ground voltage (Vss) and the node QB are coupled to each other. Therefore, the second initial data (IB2) are transferred to the node QB and the lower bit latch 134 latches the second initial data (IB2). As a result, a voltage level of the node QB is set to a logic low level and a voltage level of the node QBb is set to a logic high level.

As described above, according to the present embodiment, while the input data (PA1b) or PA2) are input to the upper bit register 120, the initial data (IB1b) or IB2) having the same value as that of the input data (PA1b) or PA2) can be stored in the lower bit register 130. Therefore, the conventional process of inputting data to an upper bit register and transmitting the data to the lower bit register can be omitted.

1-3) Period T3 of FIG. 3: Bit Line Set-up Period

During the period T3, the even discharge signal (DISCHe) is enabled to turn on the NMOS transistor N101. The bias voltage (VIRPWR) is applied to the even bit line BLe and the even bit line BLe is precharged with a logic high level. Furthermore, the odd discharge signal (DISCHo) is enabled to turn on the NMOS transistor N102. Therefore, the bias voltage (VIRPWR) is applied to the odd bit line BLo and the odd bit line BLo is precharged with a logic high level.

1-4) Period T4 of FIG. 3: Lower Bit Program Period

During the period T4, the even discharge signal (DISCHe) is disabled to turn off the NMOS transistor N101. The application of the bias voltage (VIRPWR) to the even bit line BLe is stopped accordingly. Meanwhile, since the odd discharge signal (DISCHo) is kept to an enable state during the period T4, the odd bit line BLo is kept to a logic high level. As the SLC program signal (SLCPROG) is applied to the data pass circuit N116, the sense node SO and the node P are coupled to each other.

In the case where a value of the lower bit data (DI1) to be programmed into a MLC is "1" (DI1), the first initial data (IB1b) stored in the lower bit latch 134 is inverted by the inverter I104 and the inverted first initial data (IB1) are transferred to the node P. Therefore, since a voltage level of the node P is at a logic high level, a voltage level of the sense node SO stays at a logic high level. Thereafter, the even bit line select signal (SELBLe) is applied to the bit line select unit 110 to turn on the NMOS transistor N103. Due to this, the even bit line BLe and the sense node SO are coupled to each other. Since the sense node SO is precharged with a logic high level, a voltage level of the even bit line BLe stays at a logic high level. A word line program signal is then applied to the MLC and lower bit data of "1" are programmed into the MLC. Therefore, the MLC has the same state as an erase cell.

In the case where a value of the lower bit data (DI2) to be programmed into a MLC is "0", the second initial data (IB2) stored in the lower bit latch 134 is inverted twice by the inverter I105 and the inverter I104 and the second initial data (IB2) are transferred to the node P. Since a voltage level of the node P is at a logic low level, a voltage level of the sense node SO is discharged to a logic low level. Thereafter, the even bit line select signal (SELBLe) is applied to the bit line select unit 110 and the NMOS transistor N103 is turned on accordingly. As a result, the even bit line BLe and the sense node SO are coupled to each other. Since a voltage level of the sense node SO is at a logic low level, a voltage level of the even bit line BLe is discharged to a logic low level. As a word line program signal is applied to the MLC, lower bit data of "0" are programmed into the MLC and the MLC has the same state as that of a program cell.

As described above, when controlling the lower bit program operation of the flash memory device using the page buffer according to the present invention, respective data values of respective nodes can be expressed into the following table.

TABLE 1

| Node (QAb) | | Node (QBb) | | Low Bit Data |
|---|---|---|---|---|
| Initialization Period (T1) | Data input Period (T2) | Initialization Period (T1) | Data Input Period (T2) | programmed into MLC |
| 0 | 1 | 1 | 1 | 0 |
| 0 | 0 | 1 | 0 | 1 |

Figure 4:
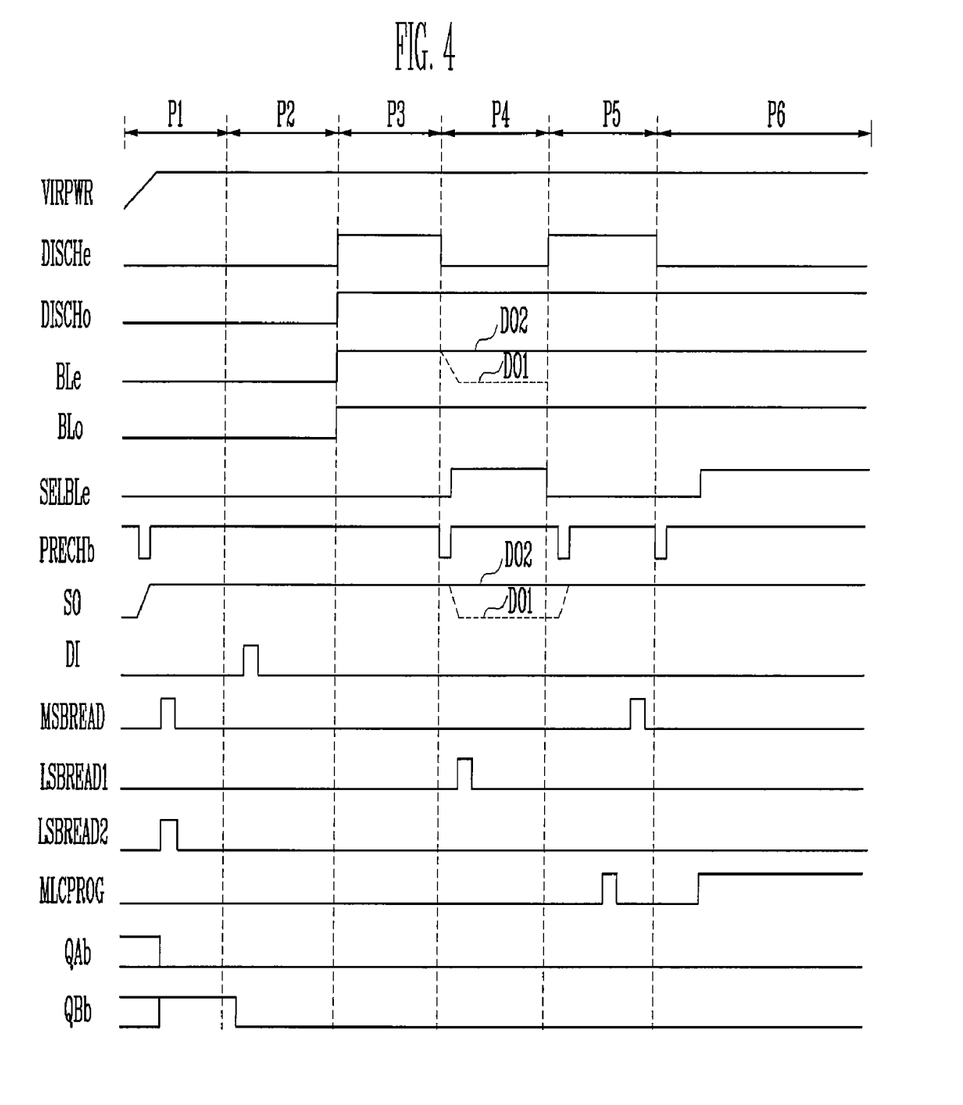
FIGS. 4 and 5 are timing diagrams illustrating signals related to an upper bit data program operation of a MLC by the page buffer shown in FIG. 2.

FIG. 4 is a timing diagram illustrating signals related to operation control of the page buffer during an upper bit data program operation having a data value of "1" shown in FIG. 2.

An upper bit program process of a MLC connected to the even bit line BLe will be described with reference to FIG. 4 by taking a program process when an upper bit data value is "1" as an example.

2-1) Period P1 of FIG. 4: Upper Bit Latch and Lower Bit Latch Initialization Period The operation of the page buffer 100 at the period P1 is substantially the same as that of the upper bit latch and lower bit latch initialization period T1, which has been described with reference to FIG. 3. Description thereof will be omitted.

2-2) Period P2 of FIG. 4: Data Input Period

The data input signal (DI) is applied to the data input circuit 150 and the latch initialization circuit 132. Therefore, the NMOS transistor N107 of the data input circuit 150 is turned on and the node QAb and the I/O terminal YA are coupled to each other. When data are input, the I/O terminal YA is in a ground state (e.g., logic low). Due to this, the first input data (PA1b) is transferred to the node QAb. Therefore, the upper bit latch 124 latches the first input data (PA1b). A voltage level of the node QAb is kept to a logic low level and a voltage level of the node QA is kept to a logic high level. Furthermore, the NMOS transistor N121 of the latch initialization circuit 132 is turned on and the ground voltage (Vss) and the node QBb are coupled to each other. Since the first initial data (IB1b) is transferred to the node QBb, the lower bit latch 134 latches the first initial data (IB1b). A voltage level of the node QBb is kept to a logic low level and a voltage level of the node QB is kept to logic high level. As a result, the first initial data (IB1b) having the same value as that of the first input data (PA1b) are stored in the lower bit latch 134.

As described above, in accordance with the present invention, while the first input data (PA1b) are input to the upper bit register 120, the first initial data (IB1b) having the same value as that of the first input data (PA1b) can be input to the lower bit register 130. Therefore, the conventional process of inputting data to an upper bit register and transmitting the data to the upper bit register can be omitted.

2-3) Period P3 of FIG. 4: Bit Line Set-up Period

The operation of the page buffer 100 at the period P3 is substantially the same as that of the bit line set-up period T3, which has been described with reference to FIG. 3. Description thereof will be omitted.

2-4) Period P4 of FIG. 4: Cell Data Read Period

During the period P4, the even discharge signal (DISCHe) is disabled and the NMOS transistor N101 of the bit line select unit 110 is turned off. Therefore, the application of the bias voltage (VIRPWR) to the even bit line BLe is stopped. The odd discharge signal (DISCHo) keeps an enable state during the period P4, so that the bias voltage (VIRPWR) continues being applied to the odd bit line BLo. A voltage level of the odd bit line BLo is kept to a logic high level. The precharge signal (PRECHb) is applied to the precharge unit P101 as a logic low level during a predetermined time and the power supply voltage ($V_{DD}$) is applied to the sense node SO accordingly. As the sense node SO is precharged with the power supply voltage ($V_{DD}$) level, a voltage level of the sense node SO is set to a logic high level. The even bit line select signal (SELBLe) is applied to the bit line select unit 110 and the NMOS transistor N103 is turned on accordingly. Therefore, the even bit line BLe and the sense node SO are coupled to each other. A voltage of the sense node SO is kept to a logic high level or becomes a logic low level depending on a value of lower bit data that are previously programmed in a MLC. The NMOS transistor N119 of the second sensing circuit 133 is turned on or off. Thereafter, the first lower bit read signal (LSBREAD1) is applied to the second sensing circuit 133 and the NMOS transistor N120 is turned on.

In the case where lower bit data (DO1) that are read from a MLC is "1", i.e., when a MLC is an erase cell, the sense node SO is discharged at a logic low level. Therefore, the NMOS transistor N119 of the second sensing circuit 133 stays "off" in response to a voltage level of the sense node SO. Due to this, although the first read signal (LSBREAD1) is applied to the second sensing circuit 133, the first initial data (IB1*b*) stored in the lower bit latch 134 keeps intact. A voltage level of the node QBb is kept to a logic low level and a voltage level of the node QB is kept to a logic high level.

In the case where the lower bit data (DO2) of a MLC is "0", i.e., when a MLC is a program cell, a voltage level of the sense node SO is kept to a logic high level. Therefore, the NMOS transistor N119 of the second sensing circuit 133 is turned on in response to the voltage level of the sense node SO. Since the first read signal (LSBREAD1) is applied to the second sensing circuit 133, the NMOS transistor N120 is turned on. Therefore, since the ground voltage (Vss) and the node QBb are connected each other, the first sensing data (SBb) of logic low level is transferred from the node QBb. As a result, the lower bit latch 134 latches the first sensing data (SBb) of logic low level.

2-5) Period P5 of FIG. 4: Data Transmission Period

As the precharge signal (PRECHb) is applied to the precharge unit P101 as a logic low level during a predetermined time, the power supply voltage ($V_{DD}$) is applied to the sense node SO. Therefore, the sense node SO is precharged as a logic high level. As the MLC program signal (MLCPROG) is applied to the second compare unit 142, the MOS transistor N112 is turned on and the NMOS transistor N113 is turned on or off in response to a voltage level of the node O. The sense node SO and the node P are connected each other or separated from each other accordingly. As the MLC program signal (MLCPROG) is applied to the first compare unit 141, the MOS transistor N110 is turned on. The NMOS transistor N111 is turned on or off in response to a voltage level of the node P. Therefore, the sense node SO and the node O are coupled to each other or separated from each other accordingly. The upper bit latch circuit 121 outputs upper bit output data (the first input data) (PA1) to the node O. Therefore, a voltage level of the node 0 becomes a logic high level and the NMOS transistor N113 of the second compare unit 142 is turned on. Therefore, the sense node SO and the node P are coupled to each other accordingly.

In the case where data latched in the lower bit latch 134 are first initial data (IB1*b*), the lower bit latch circuit 134 outputs lower bit output data (the first initial data) (IB1) to the node P. Therefore, a voltage level of the node P becomes a logic high level and the NMOS transistor N111 of the first compare unit 141 is turned on. The sense node SO and the node 0 are coupled to each other accordingly. Since the voltage level of the node O and the node P are at a logic high level, the voltage level of the sense node SO is kept to a logic high level.

In the case where data latched in the lower bit latch 134 is first sensing data (SBb), the lower bit latch circuit 134 outputs lower bit output data (first sensing data) (SB) to the node P. Therefore, as the voltage level of the node P is set to a logic high level, the NMOS transistor N111 of the first compare unit 141 is turned on. The sense node SO and the node 0 are coupled to each other accordingly. Since the voltage level of the node O and the node P are at a logic high level, the voltage level of the sense node SO is kept to a logic high level. Therefore, the NMOS transistor N106 of the first sensing circuit 122 is turned on in response to a voltage level of the sense node SO. Thereafter, as the upper bit read signal (MSBREAD) is applied to the first sensing circuit 122, the NMOS transistor N105 is turned on. Therefore, since the ground voltage (Vss) and the node QAb are coupled to each other accordingly, the second sensing data (SAb) of a logic low level is output to the node QAb. Therefore, the upper bit latch 124 outputs the second sensing data (SAb).

2-6) Period P6 of FIG. 4: Upper Bit Program Period

During the period P6, the even discharge signal (DISCHe) is disabled and the NMOS transistor N101 is turned off. Therefore, the application of the bias voltage (VIRPWR) to the even bit line BLe is stopped. During the period P6, the odd discharge signal (DISCHo) keeps enabled and the bias voltage (VIRPWR) continues to be applied to the odd bit line BLo. Therefore, a voltage level of the odd bit line BLo is kept to a logic high level. As the precharge signal (PRECHb) is applied to the precharge unit P101 at a logic low level during a predetermined time, the precharge unit P101 is turned on. As the power supply voltage ($V_{DD}$) is applied to the sense node SO, the sense node SO is precharged as the power supply voltage ($V_{DD}$) level. Therefore, the voltage level of the sense node SO is set to a logic high level. Thereafter, as the MLC program signal (MLCPROG) is applied to the second compare unit 142, the NMOS transistor N112 is turned on. As the NMOS transistor N113 is turned on or off in response to a voltage level of the node 0, the sense node SO and the node P are coupled to each other or separated from each other accordingly. Since the upper bit latch circuit 124 outputs the upper bit output data (second sensing data)(SA) of a logic high level to the node O, the voltage level of the node O is set to a logic high level and the NMOS transistor N113 of the second compare unit 142 is turned on. Therefore, the sense node SO and the node P are coupled to each other accordingly. Furthermore, as the MLC program signal (MLCPROG) is applied to the first compare unit 141, the NMOS transistor N110 is turned on. As the NMOS transistor N111 is turned on or off in response to the voltage level of the node P, the sense node SO and the node O are coupled to each other or separated from each other accordingly.

In the case where the first sensing data (SBb) are latched in the cell data read period (P4), since the lower bit latch circuit 134 outputs the lower bit output data (first sensing data) (SB) of a logic high level to the node P, the voltage level of the node P is set to a logic high level and the NMOS transistor N111 of the first compare unit 141 is turned on. The sense node SO and the node 0 are coupled to each other accordingly. Since the node O and the node P are at a logic high level, the voltage level of the sense node SO is kept to a logic high level.

Meanwhile, in the case where the first initial data (IB1*b*) is latched in the cell data read period (P4), since the lower bit latch circuit 134 outputs the lower bit output data (first initial data) (IB1) of a logic high level to the node P, the voltage level of the node P is set to a logic high level and the NMOS transistor N111 of the first compare unit 141 is turned on. Therefore, the sense node SO and the node 0 are coupled to each other accordingly. Since the node O and the node P are at a logic high level, the voltage level of the sense node SO is kept to a logic high level. Thereafter, as the even bit line select signal (SELBLe) is applied to the bit line select unit 110, the NMOS transistor N103 is turned on. The sense node SO and the even bit line BLe are coupled to each other accordingly. Therefore, the high-level voltage of the sense node SO is transferred to the even bit line BLe and the voltage level of the even bit line BLe is kept to a logic high level. Since a word line program signal is applied to a MLC, the MLC is programmed. As a result, data programmed into the MLC becomes [11] when a lower bit data value is "1" and becomes [10] when a lower bit data value is "0".

As described above, when controlling the upper bit program operation of the flash memory device using the page buffer according to an embodiment of the present invention, respective data values of respective nodes when an upper bit data value is "1" can be expressed in the following table.

TABLE 2

| | Node (QAb) | | | Node (QBb) | | | Data |
|---|---|---|---|---|---|---|---|
| Low Bit Data Read | Latch Initialization Period (P1) | Data Input Period (P2) | Data Transmission Period (P5) | Latch Initialization Period (P1) | Data Input Period (P2) | Cell Data Read Period (P4) | programmed into cell |
| 1 | 0 | 0 | 0 | 1 | 0 | 0 | 11 |
| 0 | 0 | 0 | 0 | 1 | 0 | 0 | 10 |

FIG. 4 is a timing diagram illustrating signals related to operation control of the page buffer during a program operation of low bit data having a data value of "0" shown in FIG. 2.

The upper bit program process of a MLC connected to the even bit line BLe will be described below with reference to FIG. 5.

Figure 5:
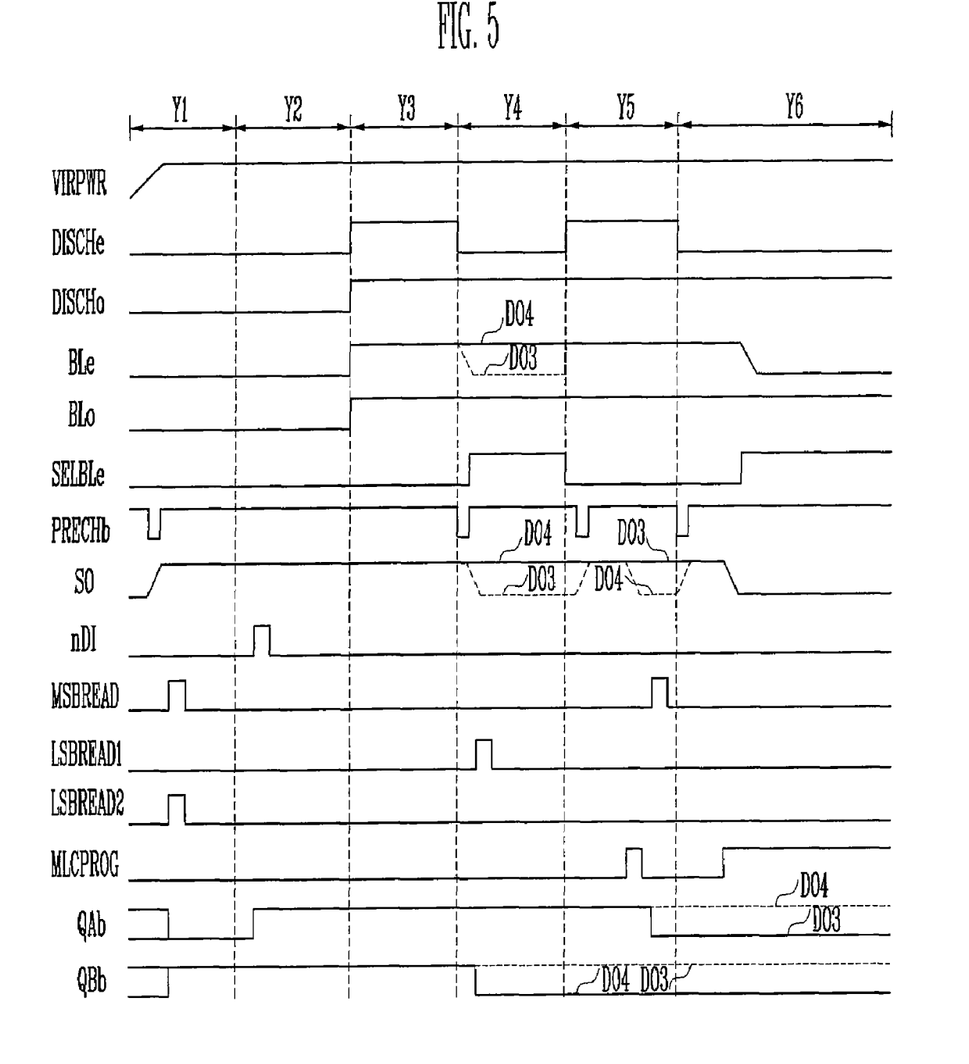

3-1) Period Y1 of FIG. 5: Upper Bit Latch and Lower Bit Latch Initialization Period The operation of the page buffer 100 at the period Y1 is substantially the same as that of the upper bit latch and lower bit latch initialization period (T1), which has been described with reference to FIG. 3. Description thereof will be omitted.

3-2) Period Y2 of FIG. 5: Data Input Period

The inverse data input signal (nDI) is applied to the data input circuit 150 and the latch initialization circuit 132. Therefore, the NMOS transistor N108 of the data input circuit 150 is turned on and the node QA and the I/O terminal YA are coupled to each other accordingly. The I/O terminal YA is in a ground state. Due to this, the second input data (PA2) is transferred to the node QA. Therefore, the upper bit latch 124 latches the second input data (PA2). A voltage level of the node QA is kept to a logic low level and a voltage level of the node QAb is kept to a logic high level.

Furthermore, as the NMOS transistor N117 of the latch initialization circuit 132 is turned on, the ground voltage (Vss) and the node QB are coupled to each other accordingly. As the second initial data (IB2) is transferred to the node QB, the lower bit latch 134 latches the second initial data (IB2). Therefore, a voltage level of the node QB is set to a logic low level and a voltage level of the node QBb is set to a logic high level. As a result, the second initial data (IB2) having the same value as that of the second input data (PA2) are stored in the lower bit latch 134.

As described above, in accordance with an embodiment of the present invention, while the second input data (PA2) is input to the upper bit register 120, the second initial data (IB2) having the same value as that of the second input data (PA2) can be input to the lower bit register 130. Therefore, the conventional process of inputting data to an upper bit register and transmitting the data to the upper bit register can be omitted.

3-3) Period Y3 of FIG. 5: Bit Line Set-up Period

The operation of the page buffer 100 at the period Y3 is substantially the same as that of the bit line set-up period (T3), which has been described with reference to FIG. 3. Description thereof will be omitted.

3-4) Period Y4 of FIG. 5: Cell Data Read Period

The operation of the page buffer 100 at the period Y4 is substantially the same as that of the cell data read period (P4), which has been described with reference to FIG. 4, except for one thing. Description thereof will be omitted. The difference is that when the lower bit data D03 read from a MLC is "1", the lower bit register 130 maintains the second initial data (IB2), and when the lower bit data DO4 are "0", the lower bit register 130 stores the first sensing data (SBb) of a logic low level therein.

3-5) Period Y5 of FIG. 5: Data Transmission Period

The operation of the page buffer 100 at the period Y5 is substantially the same as that of the data transmission period (P5), which has been described with reference to FIG. 4, except for one thing. Description thereof will be omitted. The difference is that the data compare unit 140 connects or separates one or all of the nodes O, P in response to the upper bit output data (the second input data) (PA2), the lower bit output data (the second initial data) (IB2) or the lower bit output data (the first sensing data) (SBb) to or from the sense node SO. This will be described in more detail. As the upper bit latch circuit 124 outputs the upper bit output data (the second input data) (PA2) to the node O, the node O becomes a logic low level. As the NMOS transistor N113 of the second compare unit 142 is turned off, the sense node SO and the node P are separated from each other.

In the case where the lower bit latch circuit 134 outputs the lower bit output data (the second initial data) (IB2) to the node P, the node P is set to a logic low level and the NMOS transistor N11 of the first compare unit 141 is turned off. Therefore, the sense node SO and the node O are separated from each other. Therefore, a voltage level of the sense node SO is kept to a logic high level and the NMOS transistor N106 of the first sensing circuit is turned on. The upper bit latch 124 latches the second sensing data (SAb).

In the case where the lower bit latch circuit 134 outputs the lower bit output data (the first sensing data) (SB) to the node P, the node P becomes a logic high level and the NMOS transistor N11 of the first compare unit 141 is turned on. The sense node SO and the node O are coupled to each other accordingly. Since a voltage level of the node P is a logic low level, the voltage level of the sense node SO is discharged at a logic low level. As a result, the second input data (PA2) are sustained in the upper bit latch 124.

3-6) Period Y6 of FIG. 5: Upper Bit Program Period

During the period Y6, as the even discharge signal (DISCHe) is disabled, the NMOS transistor N101 is turned off. Therefore, the application of the bias voltage (VIRPWR) to the even bit line BLe is stopped. During the period Y6, the odd discharge signal (DISCHo) keeps enabled and the bias voltage (VIRPWR) continues to be supplied to the odd bit line BLo. Therefore, a voltage level of the odd bit line BLo is kept to a logic high level. As the precharge signal (PRECHb) is applied to the precharge unit P101 at a logic low level during a predetermined time, the precharge unit P101 is turned on. Since the power supply voltage ($V_{DD}$) is applied to the sense node SO, the sense node SO is precharged as the power supply voltage ($V_{DD}$) level. The voltage level of the sense node SO is set to a logic high level accordingly.

Thereafter, since the MLC program signal (MLCPROG) is applied to the data compare unit 140, the NMOS transistor N110 of the first compare unit 141 and the NMOS transistor N112 of the second compare unit 142 are turned on. The NMOS transistor N113 of the second compare unit 142 is turned on or off in response to a voltage level of the node 0 to connect the sense node SO and the node P to each other or separate them from each other. Furthermore, the NMOS transistor N111 of the first compared circuit 141 is turned on off in response to a voltage level of the node P to connect the sense node SO and the node O to each other or separate them from each other.

In the case where the upper bit latch circuit 124 outputs the upper bit output data (the second sensing data) (SA) of a logic high level to the node O and the lower bit latch circuit 134 outputs the lower bit output data (the second initial data) (IB2) of a logic low level to the node P, the voltage level of the node O becomes a logic high level to turn on the NMOS transistor N113 of the second compare unit 142. In addition, the voltage level of the node P is set to a logic low level. Therefore, the NMOS transistor N111 of the first compare unit 141 is turned off. The sense node SO and the node P are coupled to each other and the sense node SO and the node O are separated from each other. Since the voltage level of the node P is set to a logic low level, the sense node SO is discharged at a logic low level.

In the case where the upper bit latch circuit 124 outputs the upper bit output data (the second input data) (PA2) of a logic low level to the node O and the lower bit latch circuit 134 outputs the lower bit output data (the first sensing data) (SA) of a logic high level to the node P, the voltage level of the node P is set to a logic high level to turn on the NMOS transistor N111 of the first compare unit 141. In addition, since the voltage level of the node O is set to a logic low level by the second input data (PA2), the NMOS transistor N113 of the second compare unit 142 is turned off. Therefore, the sense node SO and the node O are coupled ot each other and the sense node SO and the node P are separated from each other. Since a voltage level of the node O is set to a logic low level, the sense node SO is discharged at a low level. Thereafter, the even bit line select signal (SELBLe) is applied to the bit line select unit 110 and the NMOS transistor N103 is turned on. Therefore, the sense node SO and the even bit line BLe are coupled to each other. Since the low-level voltage of the sense node SO is transferred to the even bit line BLe, a voltage level of the even bit line BLe becomes a logic low level. As a word line program signal is applied to a MLC, the cell is programmed. As a result, the data programmed into the MLC becomes [01] when a lower bit data value is "1" and becomes [00] when the lower bit data value is "0".

As described above, when controlling the upper bit program operation of the flash memory device using the page buffer in accordance with an embodiment of the present invention, respective data values of respective nodes when the upper bit data value is "0" can be expressed into the following table.

TABLE 3

| Upper Bit Data Read | Node (QAb) | | | Node (QBb) | | | Pro-grammed Data |
|---|---|---|---|---|---|---|---|
| | Latch Initialization Period (P1) | Data Input Period (P2) | Data Transmission Period (P5) | Latch Initialization Period (P1) | Data Input Period (P2) | Cell Data Read Period (P4) | |
| 1 | 0 | 1 | 0 | 1 | 1 | 1 | 01 |
| 0 | 0 | 1 | 1 | 1 | 1 | 0 | 00 |

As described above, according to the present invention, at the time of an upper bit program and a lower bit program operation, while data are input to an upper bit register, a lower bit register is initialized using the same initial data value as that of the input data. Therefore, since a precharge time of a sense node depending on a data transmission process can be shortened, a program time can be reduced.

Furthermore, a data transmission circuit necessary for the data transmission process can be omitted. Therefore, the area of a device can be reduced and power consumption can be saved.

Although the foregoing description has been made with reference to the embodiments, it is to be understood that changes and modifications of the present invention may be made by those ordinary skilled in the art without departing from the spirit and scope of the present invention and appended claims.

What is claimed is:

1. A non-volatile memory device, comprising:
  a memory cell array having a plurality of Multi-Level Cells (MLCs), each MLC being configured to store at least first and second bits of data;
  a page buffer coupled to the memory cell array via at least first and second bit lines, the page buffer including:
    a bit line select unit configured to
      select one of the first and second bit lines, and
      connect the selected bit line to a sense node in response to bit line select signals and discharge signals;
    an upper bit register configured to
      store upper bit sensing data and output first upper bit output data in response to an upper bit read signal and a voltage level of the sense node, or
      store first or second input data received through a data I/O terminal or
      output second upper bit output data in response to data input signals;
    a data input circuit configured to transmit the first or second input data to the upper bit register in response to the data input signals; and
    a lower bit register configured to
      store lower bit sensing data and output first lower bit output data in response to a lower bit read signal and the voltage level of the sense node, or
      store first or second initial data received through a latch initialization circuit, the latch initialization circuit being configured to generate the first or second initial data in response to the data input signals or
      output second lower bit output data in response to the data input signals,
  wherein while the first or second input data is stored on the upper bit register, the first or second initial data having the same value as that of the first or second input data is stored in the lower bit register at substantially the same time in response to data input signals.

2. The device as claimed in claim 1, wherein a value of the second lower bit output data is the same as that of the second upper bit output data.

3. The device as claimed in claim 1, wherein the page buffer further comprises:
- a precharge unit configured to precharge the sense node with a set voltage level in response to a precharge signal; and
- a data compare unit configured to compare one of the first and second upper bit output data and one of the first and second lower bit output data in response to a MLC program signal, and change or maintain the voltage level of the sense node according to the comparison result.

4. The device as claimed in claim 3, wherein the upper bit register includes:
- an upper bit latch circuit configured to store the first input data, the second input data or the upper bit sensing data and output the first or second upper bit output data to the data compare unit;
- a sensing circuit configured to generate the upper bit sensing data in response to the upper bit read signal and the voltage level of the sense node; and
- a latch reset circuit configured to initialize the upper bit latch circuit in response to a reset signal.

5. The device as claimed in claim 3, wherein the lower bit register includes:
- a lower bit latch circuit configured to store the first initial data, the second initial data or the lower bit sensing data and output the first or second lower bit output data to the data compare unit; and
- a sensing circuit configured to generate the lower bit sensing data in response to the first lower bit read signal and the voltage level of the sense node.

6. A program operation control method of a non-volatile memory device including a plurality of Multi-Level Cells (MLCs) that are each configured to store at least two bits of data, the MLLCs being coupled to at least first and second bit lines, the method comprising:
- selecting one of the first and second bit lines;
- coupling the selected bit line to a sense node in response to a bit line select signal and a discharge signal;
- storing first or second input data in an upper bit register in response to data input signals and storing first or second initial data having the same value as that of the first or second input data is stored in a lower bit register at substantially the same time in response to the data input signals;
- programming the first or second initial data into a MLC coupled to the selected bit line in response to the data input signals as lower bit data; and
- programming an upper bit data which is generated by the first or second input data input to the upper bit register into the MLC in response to third or fourth initial data, the lower bit data and the data input signal wherein the first or second input data are transmitted by a data input circuit to the upper bit register in response to the data input signals.

7. The program operation control method as claimed in claim 6, wherein a value of the first input data is the same as that of the third initial data, and a value of the second input data is the same as that of the fourth initial data.

8. The program operation control method as claimed in claim 6, wherein in the step of programming the lower bit the data, when the first or second initial data are stored in the lower bit register, third or fourth input data are stored in an upper bit register in response to the data input signal, and
- a value of the first initial data is the same as that of the third input data and a value of the second initial data is the same as that of the fourth input data.

9. The program operation control method as claimed in claim 6, wherein the step of programming the lower bit data includes:
- initializing the upper bit register and the lower bit register;
- storing the first or second initial data in the lower bit register in response to the data input signal;
- coupling the selected bit line and the sense node; and
- transmitting the first or second initial data to the selected bit line using a data pass circuit.

10. The program operation control method as claimed in claim 6, wherein the step of programming the upper bit data includes:
- initializing the upper bit register and the lower bit register;
- inputting the first or second input data to the upper bit register in response to the data input signals;
- inputting the third or fourth initial data to the lower bit register in response to the data input signals;
- reading the lower bit data while maintaining the third or fourth initial data stored in the lower bit register without changing or storing lower bit sensing data corresponding to the lower bit data in the lower bit register;
- allowing a data compare unit to compare the first or second input data with one of the third initial data, the fourth initial data and the lower bit sensing data, and to maintain the first or second input data stored in the upper bit register or to store upper bit sensing data corresponding to the comparison result, according to the comparison result;
- connecting the selected bit line and the sense node; and
- allowing the data compare unit to compare one of the first input data, the second input data and the upper bit sensing data with one of the third initial data, the fourth initialization data and the lower bit sensing data, and to transmit upper bit data that are generated according to the comparison result to the selected bit line.

* * * * *